(12) United States Patent
Evans

(10) Patent No.: US 7,755,066 B2
(45) Date of Patent: Jul. 13, 2010

(54) TECHNIQUES FOR IMPROVED UNIFORMITY TUNING IN AN ION IMPLANTER SYSTEM

(75) Inventor: Morgan D. Evans, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 294 days.

(21) Appl. No.: 12/058,594

(22) Filed: Mar. 28, 2008

(65) Prior Publication Data
US 2009/0242808 A1  Oct. 1, 2009

(51) Int. Cl.
*G21K 5/10* (2006.01)
*H01J 37/08* (2006.01)
(52) U.S. Cl. .............................. 250/492.21; 250/442.11; 250/398; 250/396; 315/306; 438/10
(58) Field of Classification Search ............ 250/492.21, 250/442.11, 398, 396; 315/306; 438/10
See application file for complete search history.

(56) References Cited

U.S. PATENT DOCUMENTS

| 7,176,470 | B1 * | 2/2007 | Evans et al. ............. | 250/492.21 |
| 7,253,423 | B2 * | 8/2007 | Chang et al. ............ | 250/492.21 |
| 2004/0084636 | A1 * | 5/2004 | Berrian ................... | 250/492.21 |
| 2006/0145096 | A1 * | 7/2006 | Benveniste et al. ..... | 250/492.21 |
| 2009/0162953 | A1 * | 6/2009 | Evans et al. ............. | 438/10 |

* cited by examiner

*Primary Examiner*—Jack I Berman
*Assistant Examiner*—Meenakshi S Sahu

(57) ABSTRACT

Techniques for uniformity tuning in an ion implanter system are disclosed. In one particular exemplary embodiment, the techniques may be realized as a method for ion beam uniformity tuning. The method may comprise generating an ion beam in an ion implanter system. The method may also comprise measuring a first ion beam current density profile along an ion beam path. The method may further comprise measuring a second ion beam current density profile along the ion beam path. In addition, the method may comprise determining a third ion beam current density profile along the ion beam path based at least in part on the first ion beam current density profile and the second ion beam current density profile.

21 Claims, 7 Drawing Sheets

TECHNIQUES FOR IMPROVED UNIFORMITY TUNING IN AN ION IMPLANTER SYSTEM

FIELD OF THE DISCLOSURE

The present disclosure relates generally to semiconductor equipment and, more particularly, to techniques for improved uniformity tuning in an ion implanter system.

BACKGROUND OF THE DISCLOSURE

Ion implantation is a process of depositing chemical species into a substrate by direct bombardment of the substrate with high-energy ions. In semiconductor fabrication, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels. A specification of the ion species, doses and energies is often referred to as an ion implantation recipe.

FIG. 1 depicts a conventional ion implanter system 100. As is typical for most ion implanter systems, the ion implanter system 100 is housed in a high-vacuum environment. The ion implanter system 100 may comprise an ion source 101 and a complex series of components through which an ion beam 10 passes. The series of components may include, for example, an extraction electrode 102, a suppression electrode 103, a ground electrode 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 120 (located in a wafer plane 12). A number of measurement devices, such as a dose control Faraday cup 118, a traveling Faraday cup 124, and a setup Faraday cup 122, may be used to monitor and control the ion beam conditions.

For a uniform distribution of dopant ions, an ion beam is typically scanned across a surface of a target wafer. FIG. 2 shows a typical setup for continuous wafer implantation with an ion beam. In such a setup, a wafer 204 may flow slowly along an axis 212 through a wafer chamber. At the same time, an ion spot beam 202 having an oval cross-section may be scanned horizontally across a surface of the wafer 204. The scanned ion spot beam 202 may form a beam path 20 that has end points 208 and 210. A dose control Faraday cup 118 may be used to measure current of the ion spot beam 202.

In production, it is desirable to achieve a uniform ion beam profile along a beam path. The process of tuning an ion implanter system to achieve such a uniform ion beam profile is called "uniformity tuning."

FIG. 3 illustrates a conventional method for uniformity tuning. In a setup similar to the one shown in FIG. 2, an ion spot beam 302 having an oval cross-section is scanned at a constant scan velocity along a path 30 between end points 308 and 310. The ion spot beam 302 is relatively small compared to the size of a wafer 304, which is typical for medium- and high-energy ion beams. In existing uniformity tuning methods for these types of ion beams, it is usually assumed that: (1) the ion spot beam will maintain substantially the same size and deliver substantially the same current during scanning; and (2) the ion spot beam is scanned fully off the wafer edge. It follows from these assumptions that, during scanning, the ion spot beam will only exhibit small changes and any resulting non-uniformity in current density distribution of the scanned ion beam along its beam path is also small. Thus, in existing uniformity tuning methods, a profile of the ion beam is typically only measured once (unscanned) at the center of the wafer. In FIG. 3, a waveform 32 illustrates an individual beam dose density profile for the ion spot beam 302. As the ion spot beam 302 is swept along the path 30, the current density of the ion beam 302 at each point is an accumulated effect of one or more individual beam dose density profiles of the ion spot beam 302. A waveform 34 illustrates a current density distribution of the ion spot beam 302 between the end points 308 and 310. Since the individual beam dose density profile of the ion spot beam 302 is practically the same everywhere along the path 30, there is a linear relationship between the current density and the scan velocity of the ion spot beam 302. That is, for each location in the path 30, a small increase in the scan velocity will cause a proportional decrease in the current density of the ion spot beam 302 at that location, and a small decrease in the scan velocity will cause a proportional increase in the current density of the ion spot beam 302 at that location. Existing uniformity tuning methods are based on this assumption of linearity—if the ion beam current density profile 34 is not uniform enough, a typical approach is to adjust, for each unit distance along the path 30, the scan velocity of the ion spot beam 302 proportionally to the accumulated current density of the ion spot beam 302 within that unit distance.

It should be noted that the current density of the ion spot beam 302 rolls off quickly near both end points 308 and 310. However, since the ion spot beam 302 is scanned fully off the wafer edges, the roll-offs do not affect ion beam coverage of the wafer 304. It should also be noted that, once the ion spot beam 302 has been swept fully off the wafer 304, the current of the ion spot beam 302 no longer contributes to wafer implantation. The ratio between the accumulated ion beam current on the wafer 304 and the total ion beam current accumulated during a full scan is referred to as "beam utilization." Beam utilization indicates what portion of the total ion beam current is actually utilized for wafer implantation.

In addition, in existing ion implanter systems, uniformity tuning typically follows beam-line tuning. For example, in the ion implanter system 100 shown in FIG. 1, the ion source 101 and one or more of the beam-line elements (e.g., extraction electrode 102, suppression electrode 103, filter magnet 106, acceleration or deceleration column 108, analyzer magnet 110, scanner 114, or corrector magnet 116) are usually adjusted first to achieve a highest possible ion beam current level in order to achieve a high efficiency for ion implantation production. Only after the ion beam current has been maximized, will the uniformity tuning start.

However, due to a number of deficiencies, existing methods for tuning an ion implanter system often fail to achieve a consistent ion beam output in an efficient manner. For example, existing algorithms for tuning an ion implanter system use a single channel to measure an ion beam current density profile a number of times. Such existing algorithms measure the same ion beam current density profile a number of times in parallel and then analyze these measurements. Therefore, many iterations of measurements may be required to properly tune an ion implanter system. Thus, existing algorithms render ion implanter systems less efficient by increasing tuning time and thereby decreasing productivity.

Existing tuning algorithms also tend to use ion beam current as the only criterion to optimize an ion beam. However, identical ion beam currents do not necessarily guarantee identical ion beam conditions. For example, identical ion beam currents can be produced with several different combinations of beam-line element settings. These different combinations often cause different ion beam dimensions, positions and angles. As a result, single-parameter approaches that rely solely on ion beam current can lead to inconsistent ion beam geometries. Further, due to different ion beam geometries, extra time must be spent, for each wafer batch, on ion beam measurement, parallelism setup, uniformity setup, and implant dose control.

Existing tuning methods further tend to rely on a single set of beam-line element settings recorded in a previously successful setup. Yet, many factors in an ion implanter system can change ion beam conditions even if beam-line element settings are maintained constant. For instance, an ion source usually has a lifetime during which ion generation gradually degrades. Therefore, even with identical beam-line element settings, ion beam current can be quite different depending on the length of time an ion source has been in use. Since a previously recorded single set of beam-line element settings often cannot reproduce a desired ion beam condition, an ion implanter system may have to be re-tuned for every wafer batch, which is quite time-consuming for reasons described below.

In view of the foregoing, it may be understood that there are significant problems and shortcomings associated with current ion implanter tuning technologies.

SUMMARY OF THE DISCLOSURE

Techniques for improved uniformity tuning in an ion implanter system are disclosed. In one particular exemplary embodiment, the techniques may be realized as a method for improved uniformity tuning in an ion implanter system. The method may comprise generating an ion beam in an ion implanter system. The method may also comprise measuring a first ion beam current density profile along an ion beam path. The method may further comprise measuring a second ion beam current density profile along the ion beam path. In addition, the method may comprise determining a third ion beam current density profile along the ion beam path based at least in part on the first ion beam current density profile and the second ion beam current density profile.

In accordance with other aspects of this particular embodiment, the step of measuring the first ion beam current density profile may further comprise measuring the first ion beam current density profile at one or more predetermined locations with one or more stationary measurement devices.

In accordance with further aspects of this particular exemplary embodiment, the one or more predetermined locations of the one or more stationary measurement devices may be located along one or more sides of the ion beam path.

In accordance with additional aspects of this particular exemplary embodiment, the one or more stationary measurement devices may comprise at least one closed loop Faraday cup.

In another particular exemplary embodiment, measuring the first ion beam current density profile may measure the first ion beam current density profile as a function of time.

In yet another particular exemplary embodiment, the step of measuring the second ion beam current density profile along the ion beam path may further comprise scanning a cross-section of the ion beam via a mobile measurement device.

In still another particular exemplary embodiment, the mobile measurement device may be positioned substantially in parallel with a wafer plane.

In a further particular exemplary embodiment, the mobile measurement device may be a profiling Faraday cup.

In accordance with other aspects of this particular exemplary embodiment, measuring the second ion beam current density profile may measure the second ion beam current density profile as a function of time and spatial position.

In accordance with additional aspects of this particular exemplary embodiment, the third ion beam current density profile may be a function of spatial position.

In accordance with yet another aspect of this particular exemplary embodiment, the method may further comprise determining a confidence level associated with a uniformity of the third ion beam current density profile.

In accordance with other aspects of this particular exemplary embodiment, the method may further comprise calculating a confidence interval based at least in part on the first ion beam current density profile, the second ion beam current density profile and the confidence level.

In accordance with further aspects of this particular exemplary embodiment, the method may further comprise determining whether the uniformity of the third ion beam current density profile may be included within the confidence interval.

In accordance with other aspects of this particular exemplary embodiment, in the event that the uniformity of the third ion beam current density profile is included within the confidence interval, stopping the ion beam uniformity tuning.

In accordance with further aspects of this particular exemplary embodiment, in the event that the uniformity of the third ion beam current density profile may not be included within the confidence interval, tuning one or more beam-line elements to adjust the uniformity of the third ion beam current density profile.

In accordance with yet another aspect of this particular exemplary embodiment, at least one processor readable medium for storing a computer program of instructions may be configured to be readable by at least one processor for instructing the at least one processor to execute a computer process for performing the uniform tuning method.

In accordance with another aspect of this particular exemplary embodiment, techniques may be realized as a system for improved uniformity tuning in an ion implanter system. The system may comprise an ion source for generating an ion beam in an ion implanter system. The system may also comprise one or more first devices for measuring a first ion beam current density profile along an ion beam path. The system may further comprise a second device measuring a second ion beam current density profile along the ion beam path. In addition, the system may comprise a processor for determining a third ion beam current density profile along the ion beam path based at least in part on the first ion beam current density profile and the second ion beam current density profile.

In accordance with other aspects of this particular exemplary embodiment, the one or more first devices may comprise at least one closed loop Faraday cup located along one or more sides of the ion beam path.

In accordance with additional aspects of this particular exemplary embodiment, the one or more first devices may measure the first ion beam current density profile as a function of time.

In accordance with yet another aspect of this particular exemplary embodiment, the second device may comprise a profiling Faraday cup for scanning a cross-section of the ion beam via a mobile measurement device.

In accordance with still another aspect of this particular exemplary embodiment, the second device may measure the second ion beam current density profile as a function of time and spatial position.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure are directed to techniques for improved uniformity tuning in an ion implanter system. According to an improved method, an ion beam profile along a beam path can be precisely determined by measuring the ion beam at a plurality of predetermined locations. The measurements of the ion beam at the plurality of predetermined locations may be taken as function of one or more variables. Also, the measurements may be taken with either a stationary measurement device or a mobile measurement device. The ion beam profile may accurately capture all changes, large or small, in the ion beam during scanning. Based on this ion beam profile, a desired scan velocity profile may be generated to closely control scanning of the ion beam in order to achieve a more uniform ion beam profile. This improved method may reduce the number of iterations required for uniformity tuning of an ion implanter system and may introduce a confidence level in the uniformity tuning of the ion implanter system.

Figure 1:
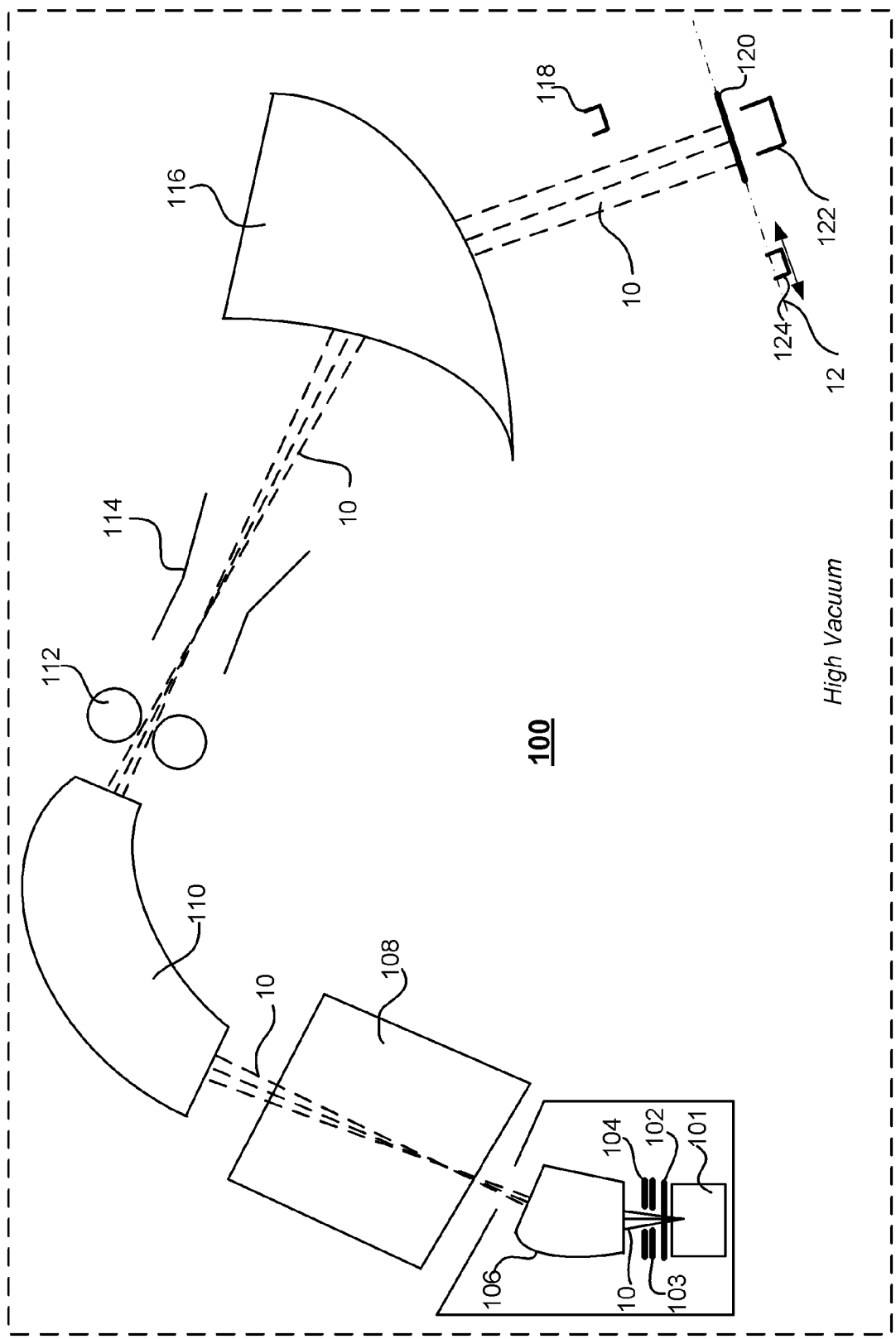
FIG. 1 is a diagram illustrating a conventional ion implanter system.
Figure 2:
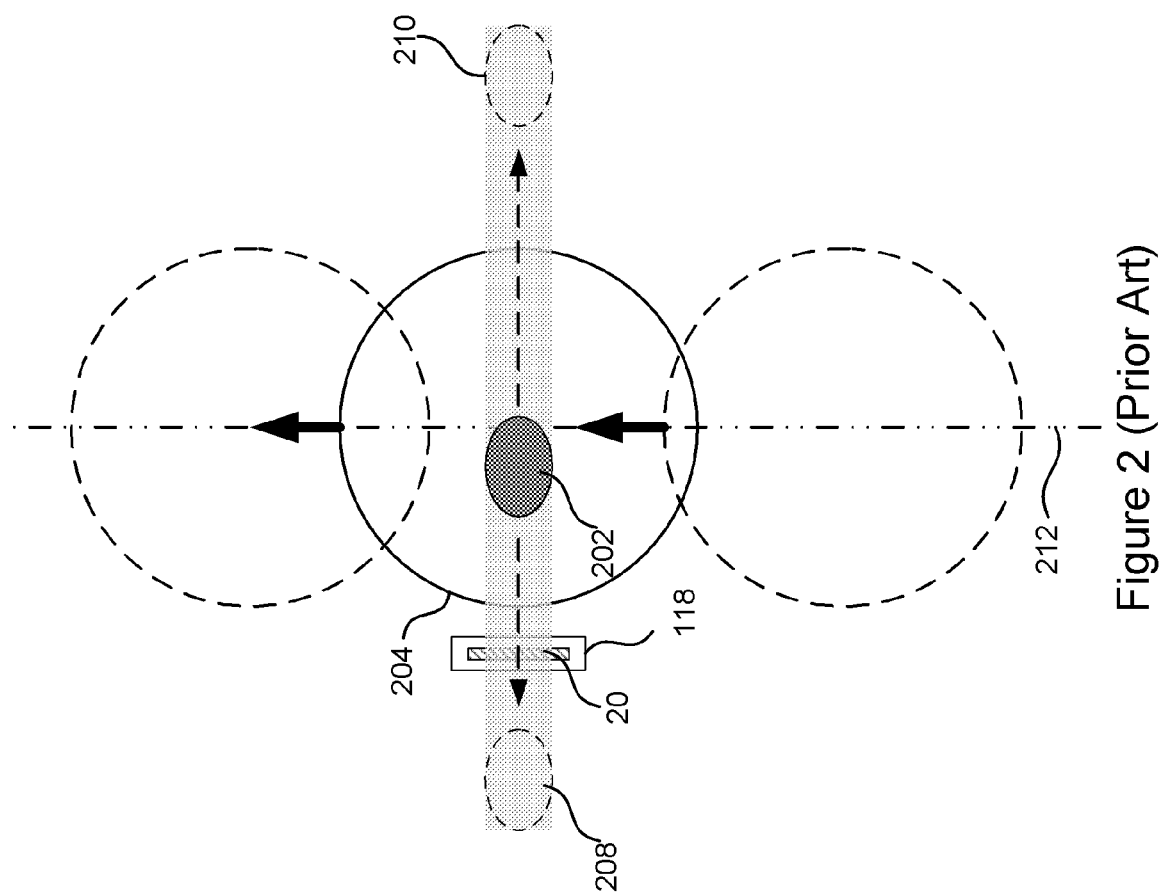
FIG. 2 illustrates a typical setup for scanning a series of wafers with an ion beam.
Figure 3:
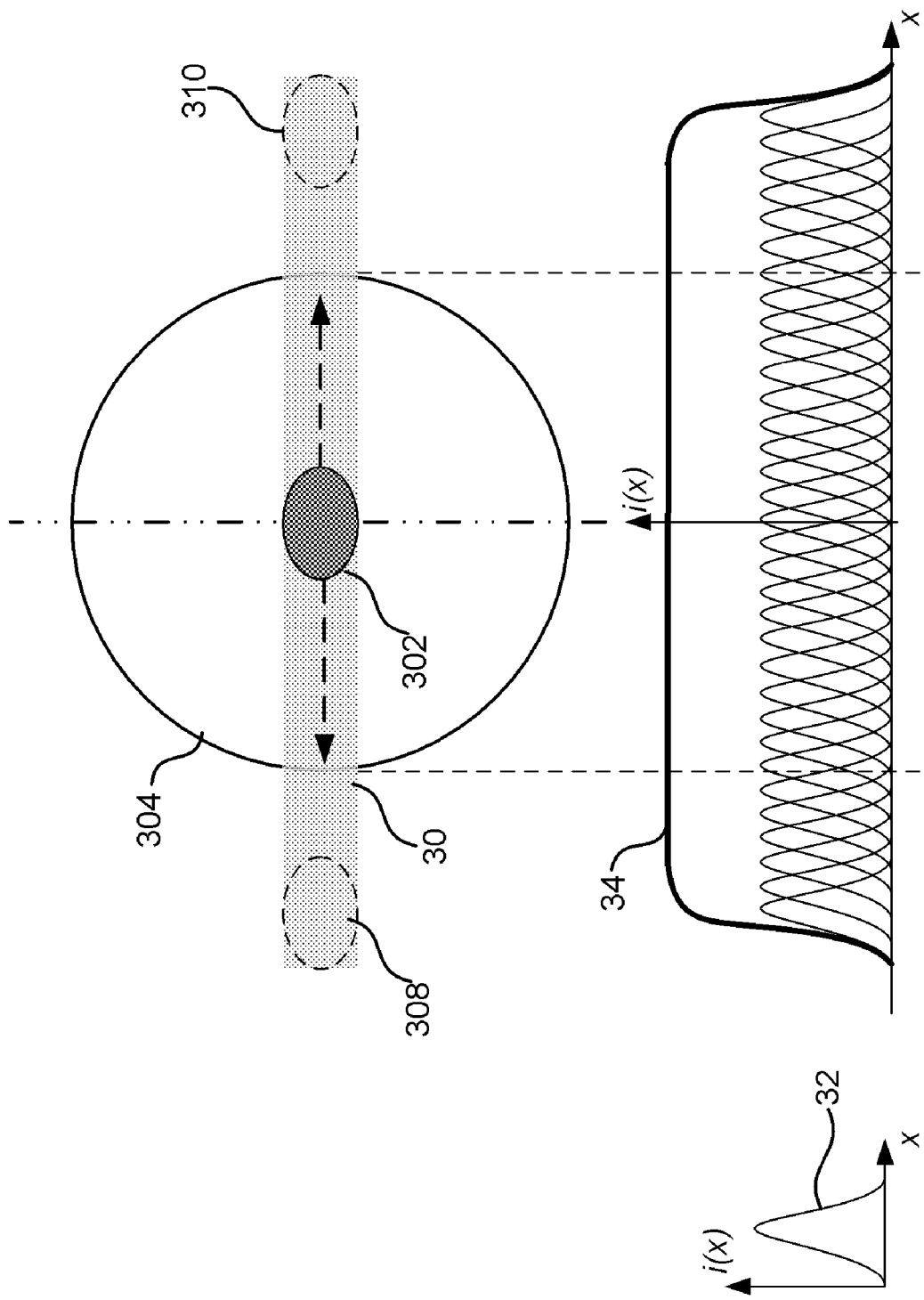
FIG. 3 illustrates a conventional method for uniformity tuning.
Figure 4:
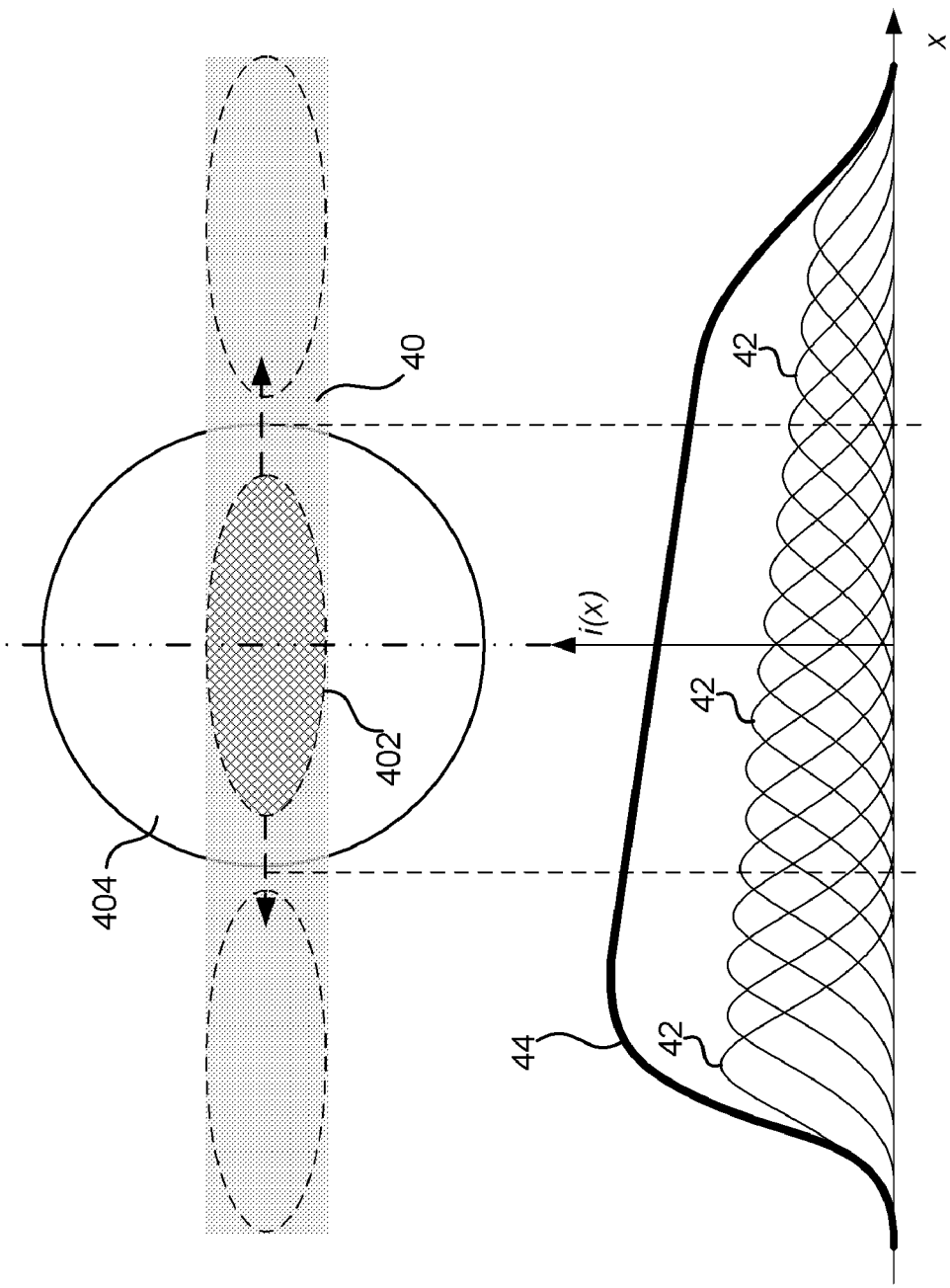
FIG. 4 illustrates an ion spot beam being scanned across a wafer in accordance with an embodiment of the present disclosure.

FIG. 4 illustrates an ion spot beam 402 being scanned along an ion beam path 40 across a wafer 404. For example, the ion spot beam 402 may be a sweeping ion beam and/or a ribbon beam. As shown, the size of the ion spot beam 402 is comparable to the size of the wafer 404. Thus, the wafer 404 may see a full ion spot beam along a portion of the ion beam path 40. Further, the individual beam dose density profiles 42 of the ion spot beam 402 may vary along the ion beam path 40, and the resulting scanned ion beam current density profile may be shown by waveform 44. As illustrated in FIG. 4, as the ion spot beam 402 is swept along the ion beam path 40, the ion beam current density of the scanned ion beam at each point is an accumulated effect of one or more individual beam dose density profiles of the ion spot beam 402. Each individual beam dose density profile 42 illustrates an "individual beam dose density distribution" for the scanned ion spot beam 402. The waveform 44 illustrates a "current density distribution" of the scanned ion beam along the ion beam path 40, which may also be referred to as a "scanned beam profile." The scanned beam profile 44 is the beam current density delivered by the scanned ion spot beam 402 along the ion beam path 40. The effect of the scanned ion spot beam 402 can be considered equivalent to an infinite number of unscanned ion spot beams located in a series of continuous positions along ion beam path 40, wherein each of the unscanned ion spot beams delivers a beam current for an infinitesimal duration. In a numerical simulation, however, the current density distribution (or scanned beam profile) of the scanned ion spot beam 402 may be approximated with a finite number of unscanned ion spot beams, each delivering a beam current for a finite duration, as will be described in detail below. The spatial distribution of a spot beam current density is called a "spot beam profile." The individual beam dose density distribution 42 is therefore the product of a corresponding spot beam profile and a finite duration.

Figure 5:
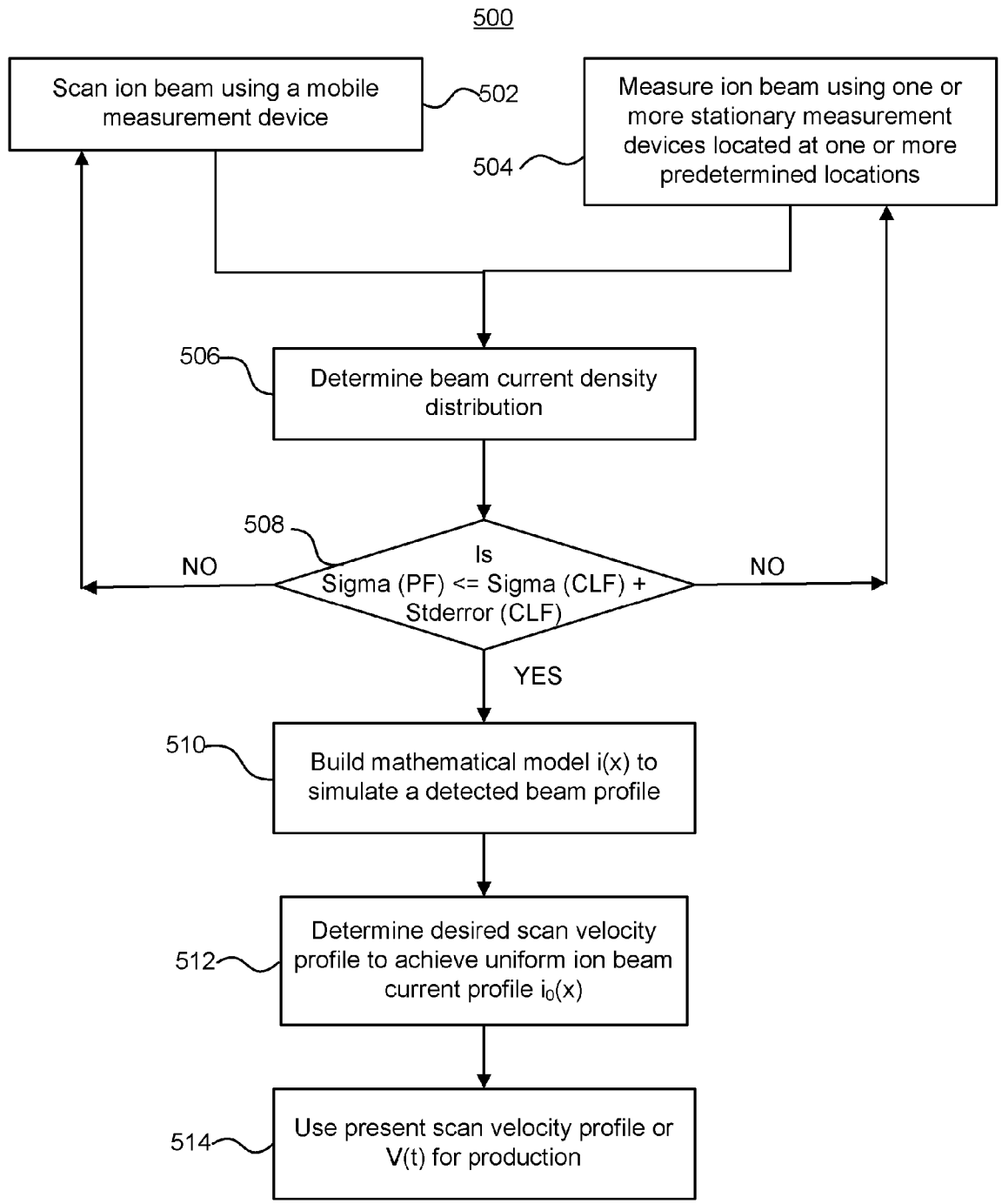
FIG. 5 is a flow chart illustrating an exemplary method for uniformity tuning in an ion implanter system in accordance with an embodiment of the present disclosure.

Referring to FIG. 5, there is shown a flow chart illustrating an exemplary method for uniformity tuning in an ion implanter system in accordance with an embodiment of the present disclosure. In step 502, an ion beam may be scanned using a mobile measurement device via a first electronic channel in an ion implanter system. Scanning of the ion beam may follow a predetermined scan velocity profile. The scan velocity profile $v(x)$, x being a scan distance from a scanning origin (e.g., center of a wafer), may be achieved by controlling the scanning mechanism with a voltage waveform $V(t)$, for example. According to one embodiment of the disclosure, the ion beam may be scanned in step 502 at a slow and constant velocity (e.g., $1/10^{th}$ of a hertz or 10 seconds of travel time to cover a desired scanning distance). The mobile measurement device may measure current density distribution over time $I_{pf}(t)$ and/or the position of the mobile measurement device over time $X_{pf}(t)$. The measured current density distribution $I_{pf}(t)$ in relation with the position of the mobile measurement device $X_{pf}(t)$ may be translated into a spot beam profile relative to the time and the position $I_{pf}(x, t)$. For example, if the ion implanter system is tuned to achieve a uniform ion beam current, a current-measuring Faraday cup (e.g., profiling faraday cup) may be used as the mobile measurement device. However, it should be appreciated that other measurement devices may also be used in accordance with alternative embodiments of the present disclosure.

The mobile measurement device may measure current density distribution continuously along a desired scanning path. Also, the mobile measurement device may measure current density distribution intermittently (e.g., every millimeter) along the desired scanning path. For illustration purposes, the spot beam current density distribution measured along a desired scanning path may be referred to as spot beam current density distribution measurements $I_{pf}(1)$, $I_{pf}(2)$, ... and $I_{pf}(N)$. The position of each spot beam current density distribution measurement taken may be marked by its distance from the scanning origin. Thus, the spot beam current density distribution measurements $I_{pf}(1)$, $I_{pf}(2)$, ... and $I_{pf}(N)$ may have positions at $X_{pf}(1)$, $X_{pf}(2)$, ... $X_{pf}(N)$, respectively. In some embodiments, a profiling faraday cup may be set up along a scanning path of an ion beam, and may be positioned in a wafer plane or in a plane that is substantially in parallel with a wafer plane.

In step 504, the ion beam may be measured using one or more stationary measurement devices via a second electronic channel in the ion implanter system. For example, step 504 may be performed prior to step 502, simultaneously with step 502 or successively after step 502. The one or more stationary measurement devices may measure current density over time $I_{cf}(t)$ at one or more predetermined positions along the ion beam path. Also, the one or more stationary measurement devices located at the one or more predetermined positions may be adjusted to different positions. For example, a current-measuring Faraday cup (e.g., closed loop faraday cup) may be used as the one or more stationary measurement devices. However, it should be appreciated that other measurement devices may also be used in accordance with alternative embodiments of the present disclosure.

The one or more stationary measurement devices may measure current density distribution continuously during a scanning period. Also, the one or more stationary measurement devices may measure current density distribution intermittently (e.g., every nanosecond, every millisecond, every second, etc.) during the scanning period. For illustration purposes, four stationary measurement devices may be positioned along the ion beam path. For example, each of the four stationary measurement devices may be placed at a front side, a rear side, a left side, and a right side of the ion beam path. Each of the one or more stationary measurement devices may measure the current density distribution measured during the scanning period. These measurements may be referred to as spot beam current density distribution measurements $I_{cf1}(1)$, $I_{cf1}(2)$, . . . and $I_{cf1}(N)$, $I_{cf2}(1)$, $I_{cf2}(2)$, . . . and $I_{cf2}(N)$, $I_{cf3}(1)$, $I_{cf3}(2)$, . . . and $I_{cf3}(N)$, and $I_{cf4}(1)$, $I_{cf4}(2)$, . . . and $I_{cf4}(N)$. In some embodiments, these measurements may be taken by one or more closed loop faraday cups set up along the ion beam path, and positioned on a side of a wafer plane and offset from a wafer plane.

Figure 6:
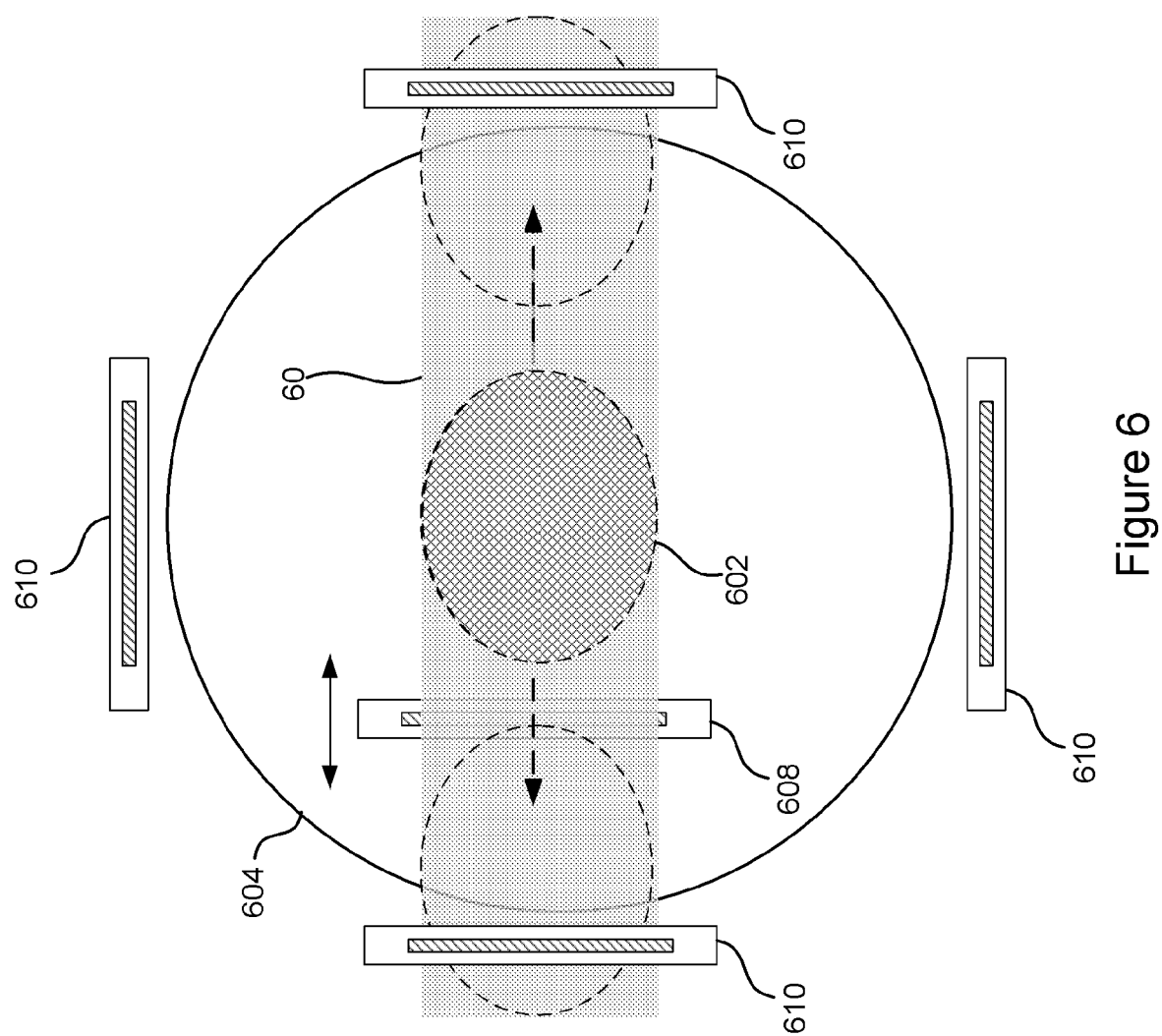
FIG. 6 illustrates an exemplary setup for uniformity tuning in an ion implanter system in accordance with an embodiment of the present disclosure.

FIG. 6 illustrates an exemplary setup in accordance with an embodiment of the present disclosure. In FIG. 6, an ion spot beam 602 is scanned along an ion beam path 60 across a wafer 604. Mobile measurement device 608 may scan spot beam current density distributions along the ion beam path 60 in a wafer plane or in a plane that is substantially parallel to the wafer plane. As shown, the mobile measurement device 608 may be moving back and forth along the ion beam path 60 as indicated by an arrow. However, other arrangements may also be effective for measurement purposes. Also, one or more stationary measurement devices 610 may be positioned outside and/or offset from a wafer plane. As illustrated, four stationary measurement devices 610 may be positioned at four sides of the ion beam path 60. The one or more stationary measurement devices 610 may also be positioned at various locations to measure a current density distribution.

Referring back to FIG. 5, in step 506, a plurality of spot beam current density distributions (or spot beam profiles) $P_{pf}(1)$, $P_{pf}(2)$, . . . and $P_{pf}(N)$, may be determined at each of the measurement positions $X_{pf}(1)$, $X_{pf}(2)$, . . . and $X_{pf}(N)$ of the first electronic channel (e.g., a channel of an oscilloscope). The mobile measurement device may measure a spot beam current density in relation with the measurement positions as the ion beam is scanned through the desired scanning path, and the measured spot beam current density in relation with the measurement positions may then be translated into a spot beam profile.

Also, a plurality of spot beam current density distributions (or spot beam profiles) $P_{cf}(1)$, $P_{cf}(2)$, . . . and $P_{cf}(N)$, may be determined at the various measurement times for each of the one or more stationary measurement devices. The one or more stationary measurement devices may measure a spot beam current density in relation with the measurement times as the ion beam is scanned through the desired scanning path, and the measured spot beam current density in relation with the measurement times may then be translated into a spot beam profile. According to one embodiment, a plurality of spot beam current density distributions, $P_{cf1}(1)$, $P_{cf1}(2)$, . . . and $P_{cf1}(N)$, $P_{cf2}(1)$, $P_{cf2}(2)$, . . . and $P_{cf2}(N)$, $P_{cf3}( )$, $P_{cf3}(2)$, . . . and $P_{cf3}(N)$, $P_{cf4}(1)$, $P_{cf4}(2)$, . . . and $P_{cf4}(N)$, may be determined for each of the four stationary measurement devices.

In step 508, a relative standard deviation (SIGMA) of the measured plurality of spot beam current density distributions (or spot beam profiles $P_{pf}(1)$, $P_{pf}(2)$, . . . and $P_{pf}(N)$) of the mobile measurement device may be determined. Also, a sum of a relative standard deviation (SIGMA) and a standard of error of the plurality of spot beam current density distributions (or spot beam profiles $P_{cf}(1)$, $P_{cf}(2)$, . . . and $P_{cf}(N)$) of the one or more stationary measurement devices may be determined. Thereafter, it may be determined whether the relative standard deviation (SIGMA) of the mobile measurement device is smaller than or equal to the sum of the relative standard deviation (SIGMA) and the standard of error of the one or more stationary measurement devices. According to one embodiment, the plurality of current density distributions associated with the mobile measurement device and/or the one or more stationary measurement devices may be assumed to be approximately normally distributed samples. Therefore, a relative standard deviation may be defined by the percentage of standard deviation of measured spot beam current density distributions divided by the average of measured spot beam current density distributions.

The relative standard deviation of the measured plurality of spot beam current density distributions (or spot beam profiles $P_{pf}(1)$, $P_{pf}(2)$, . . . and $P_{pf}(N)$) of the mobile measurement device may be determined by calculating a percentage of a standard deviation of the plurality of spot beam current density distributions ($P_{pf}(1)$, $P_{pf}(2)$, . . . and $P_{pf}(N)$) divided by a mean of the plurality of spot beam current density distributions ($P_{pf}(1)$, $P_{pf}(2)$, . . . and $P_{pf}(N)$). Also, the relative standard deviation of the plurality of spot beam current density distributions (or spot beam profiles $P_{cf}(1)$, $P_{cf}(2)$, . . . and $P_{cf}(N)$) of the one or more stationary measurement devices may be determined by calculating a percentage of a standard deviation of the plurality of spot beam current density distributions ($P_{cf}(1)$, $P_{cf}(2)$, . . . and $P_{cf}(N)$) divided by a mean of the plurality of spot beam current density distributions ($P_{cf}(1)$, $P_{cf}(2)$, . . . and $P_{cf}(N)$). A relative standard deviation may be determined for each of the one or more stationary measurement devices. An average of the relative standard deviations for each of the one or more stationary measurement devices may be calculated to determine an ion beam uniformity of the ion implanter system.

The standard error of the plurality of spot beam current density distributions (or spot beam profiles $P_{cf}(1)$, $P_{cf}(2)$, . . . and $P_{cf}(N)$) of the one or more stationary measurement devices may be defined as the standard deviation of the means of each of the plurality of spot beam current density distributions ($P_{cf}(1)$, $P_{cf}(2)$, . . . and $P_{cf}(N)$) of the one or more stationary measurement devices. According to an embodiment of the present disclosure, four arrays of spot beam current density distributions $P_{cf1}(1)$, $P_{cf1}(2)$, . . . and $P_{cf1}(N)$, $P_{cf2}(1)$, $P_{cf2}(2)$, . . . and $P_{cf2}(N)$, $P_{cf3}(1)$, $P_{cf3}(2)$, . . . and $P_{cf3}(N)$, $P_{cf4}(1)$, $P_{cf4}(2)$, . . . and $P_{cf4}(N)$ may be associated with four stationary measurement devices located at various positions along the ion beam path. The mean for each array of spot beam current density distribution may be different because of the different locations along the ion beam path. The standard deviation of the means of the four arrays of spot beam current density distributions may be calculated to determine the standard error of the four arrays of spot beam current density distributions.

In addition, a confidence level (e.g., how likely a confidence interval is to contain the measured spot beam current density distributions) may be chosen based on a number of standard deviations of the mean of $P_{clf}(t)$. For example, one standard deviation of the mean may have a confidence level of approximately 68%, two standard deviations of the mean may have a confidence level of approximately 95%, while three standard deviations of the mean may have a confidence level of approximately 99%. Also, the confidence level may be a predetermined specification of the uniformity turning process. For example, a confidence level of approximately 95% or an ion beam uniformity of within 0.5% may be chosen for the ion beam uniformity tuning process and therefore restrict the value of the current density and the time variable. In the event that the spot beam current density $I_{clf}(t)$ for the one or more stationary measurement devices may have a confidence level of 95%, one may infer that the spot beam current density $I_{pf}(x, t)$ of the mobile measurement device may not have a confidence level higher than 95%. That is, the spot beam current density $I_{clf}(t)$ of the one or more stationary measurement devices is a function of time, and the spot beam current density $I_{pf}(x, t)$ of the mobile measurement device is a function of time and position. Therefore, the spot beam current density $I_{pf}(x, t)$ of the mobile measurement device may not have a confidence level higher than 95%.

If the relative standard deviation of the measured plurality of spot beam current density distributions (or spot beam profiles $P_{pf}(1), P_{pf}(2), \ldots$ and $P_{pf}(N)$) of the mobile measurement device is smaller than or equal to the sum of the relative standard deviation of the plurality of spot beam current density distributions (or spot beam profiles $P_{clf}(1), P_{clf}(2), \ldots$ and $P_{clf}(N)$) of the one or more stationary measurement devices and the standard error of the plurality of spot beam current density distributions (or spot beam profiles $P_{clf}(1), P_{clf}(2), \ldots$ and $P_{clf}(N)$) of the one or more stationary measurement devices, then the present scan velocity profile $V(x)$ or scan voltage waveform $V(t)$ may be used for wafer production in step 514. However, if the relative standard deviation of the measured plurality of spot beam current density distributions (or spot beam profiles $P_{pf}(1), P_{pf}(2), \ldots$ and $P_{pf}(N)$) of the mobile measurement device is not smaller than or equal to, the sum of the relative standard deviation of the plurality of spot beam current density distributions (or spot beam profiles $P_{clf}(1), P_{clf}(2), \ldots$ and $P_{clf}(N)$) of the one or more stationary measurement devices and the standard error of the plurality of spot beam current density distributions (or spot beam profiles $P_{clf}(1), P_{clf}(2), \ldots$ and $P_{clf}(N)$) of the one or more stationary measurement devices, then the ion beam current profile is not uniform enough. In that case, the ion source and/or the one or more beam-line elements may be tuned and the process may loop back to step 502 and/or step 504 and the scan velocity profile may be adjusted or recalculated. The desired adjustments or corrections may be calculated and applied to an initial and/or a previous scan velocity profile. The adjustments or corrections may be applied in an iterative process. In practice, adjustments may be calculated and applied to a voltage waveform $V(t)$ that controls the scanning of the ion beam.

In step 510, a mathematical model $i_{pf}(X)$ may be built for the ion beam profile. According to one embodiment, an individual beam dose density distribution for a measurement position $X_{pf}(K)$ may be approximated by multiplying the spot beam profile $P_{pf}(K)$ with a duration $t_k$ during which the spot beam delivers current to the location $X_{pf}(K)$. All the individual spot beam dose density distributions $P_{pf}(1)t_1, P_{pf}(2)t_2, \ldots$ and $P_{pf}(M)t_M$ may be summed to generate the scanned beam profile model $i_{pf}(x)=P_{pf}(1)t_1+P_{pf}(2)t_2+ \ldots +P_{pf}(M)t_M$, wherein $t_1+t_2+ \ldots +t_M=T$, T being the total scan time for the ion beam to scan from one endpoint to the other.

Also in step 510, a mathematical model $i_{clf}(x)$ may be built for a measured beam profile for each of the one or more stationary devices. According to one embodiment, an individual beam dose density distribution for one or more predetermined measurement positions may be approximated by multiplying the spot beam profile $P_{clf}(K)$ with a duration $t_k$ during which the spot beam delivers current to the predetermined measurement position. All the individual spot beam dose density distributions $P_{clf}(1)t_1, P_{clf}(2)t_2, \ldots$ and $P_{clf}(M)t_M$ may be summed to generate the scanned beam profile model $i_{clf}(x)=P_{clf}(1)t_1+P_{clf}(2)t_2+ \ldots +P_{clf}(M)t_M$, wherein $t_1+t_2+ \ldots +t_M=T$, T being the total scan time for the ion beam to scan from one endpoint to the other.

In step 512, a desired scan velocity profile may be determined based on the measured beam profile model $i_{pf}(x)$ and/or $i_{clf}(x)$. For example, to achieve a uniform beam profile, the model $i_{pf}(x)=P_{pf}(1)t_1+P_{pf}(2)t_2+ \ldots +P_{pf}(M)t_M$, may be adjusted to minimize its standard deviation over the ion beam path based at least in part on the beam profile module $i_{clf}(x)$. That is, the scan velocity profile may be adjusted and/or optimized to generate a uniform ion beam profile $i_0(x)$. For example, for locations where the ion beam current is lower than desired, the local scan velocity may be reduced (i.e., longer scan duration). Conversely, for locations where the ion beam current is higher than desired, the local scan velocity may be increased (i.e., shorter scan duration). The model-predicted profile $i_0(x)$ may be used to predict an initial scan voltage waveform $V_0(t)$. Alternatively, an initial scan velocity profile $V_0(x)$ may be determined based on durations $t_1, t_2, \ldots$ and $t_M$. The model $i_0(x)$ may be used to simulate or predict the scanned ion beam profile $s(x)$. The scanned ion beam profile $s(x)$ may be the actual beam current density value of a scanned ion beam as a function of scanning distance $x$.

In step 514, the uniform ion beam profile $i_0(x)$ may be within a specified uniformity and may use a present scan velocity profile or scan voltage waveform $V(t)$ for production. The improved method for uniformity tuning, as described above, requires less iterations than conventional methods for uniformity tuning while introducing confidence levels to the uniformity tuning. That is, the improved method no longer relies on the assumption that the current density over time will remain constant. Therefore, embodiments of the present disclosure may be successfully applied to an ion implanter system.

Figure 7:
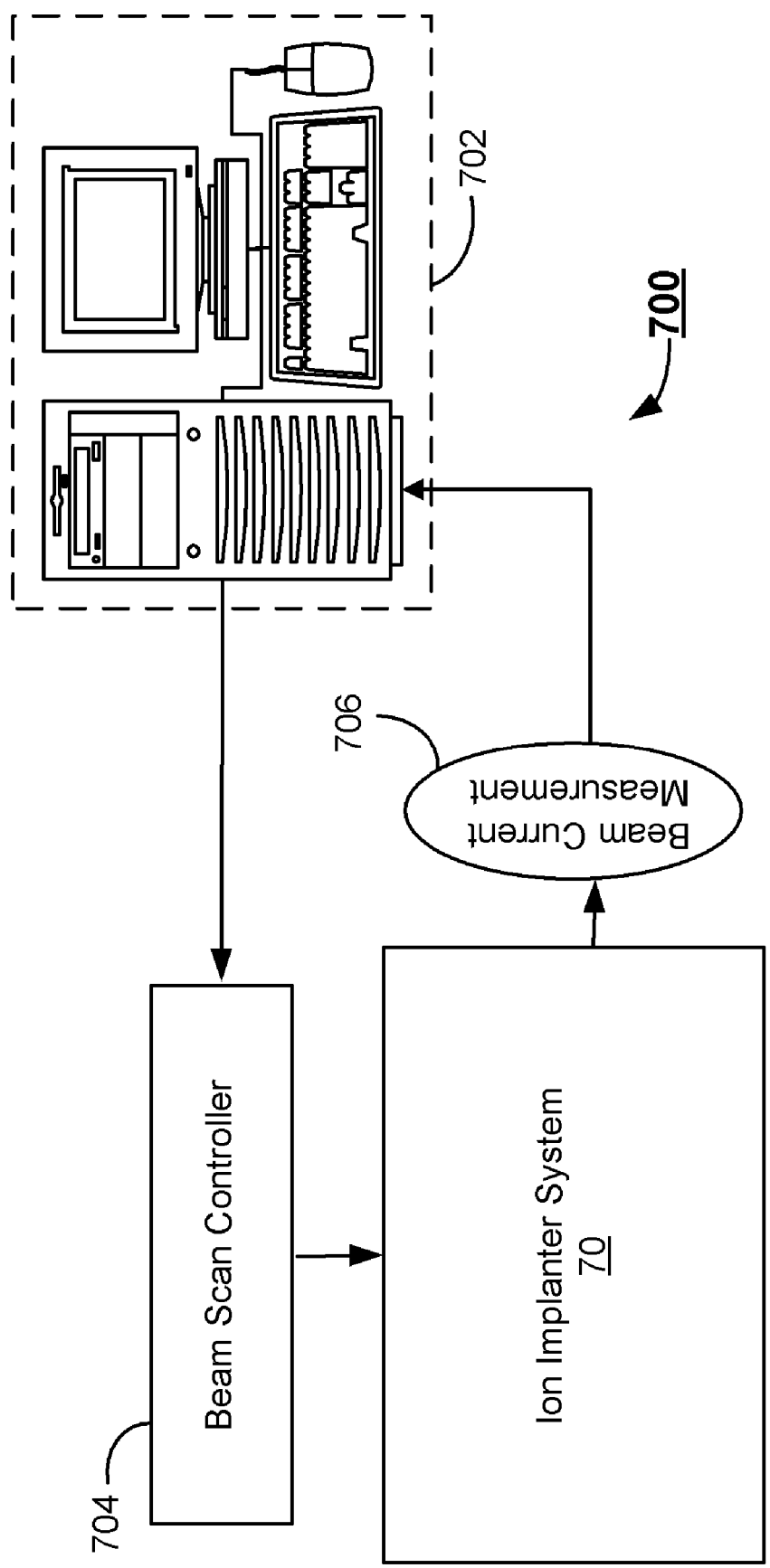
FIG. 7 illustrates an exemplary system for uniformity tuning in an ion implanter system in accordance with an embodiment of the present disclosure.

FIG. 7 illustrates an exemplary system for uniformity tuning in an ion implanter system 700 in accordance with an embodiment of the present disclosure. The system 700 may comprise a processor unit 702 which may be a microprocessor, micro-controller, personal computer (PC), or any other processing device. The system 700 may also comprise a beam scan controller 704 that controls a scanned ion beam in an ion implanter system 70 according to instructions received from the processor unit 702. The system 700 may further comprise a beam current measurement interface 706 through which the processor unit 702 may receive ion beam current data from the ion implanter system 70. The beam current measurement interface 706 may include or be coupled to an array of Faraday cups positioned in or near an ion beam path.

In operation, the processor unit 702 may send a scan instruction with a slow and/or constant scan velocity profile to the beam scan controller 704. The beam scan controller 704 may then cause an ion beam in the ion implanter system 70 to scan across the array of faraday cups along an ion beam path according to the scan velocity profile. At the same time, the data of the plurality of spot beam profiles measured by the array of faraday cups may be forwarded to the processor unit 702 via the beam current measurement interface 706. The processor unit 702 may mathematically create a model for uniformly tuning a scanned ion beam current density distribution along the ion beam path by using a series of spot beam profiles based on the data of the plurality of spot beam profiles. The processor unit 702 may then calculate an initial scan velocity profile by optimizing or otherwise adjusting the model of the scanned beam profile to predict a uniformity of a scanned beam profile with a minimized standard deviation. Next, the processor unit 702 may send a scan instruction with an initial and/or a tuned scan velocity profile to the beam scan controller 704. The beam scan controller 704 may then cause the ion beam in the ion implanter system 70 to scan along the ion beam path according to the initial and/or the tuned scan velocity profile. At the same time, the scanned ion beam current density distribution data measured by the mobile and/or the one or more stationary Faraday cups may be forwarded to the processor unit 702 via the beam current measurement interface 706. The processor unit 702 may determine a uniformity of the scanned beam profile. If the scanned beam profile is not uniform enough, the processor unit 702 may use adjust the ion source and/or the one or more beam-line elements to achieve a desired scan velocity profile. The desired scan velocity profile may be communicated to the beam scan controller 704 which may cause a re-scan of the ion beam according to the desired scan velocity profile. Another measurement of the scanned ion beam current density distribution may be performed and the data may be sent to the processor unit 702. The process may be repeated until the processor unit 702 determines that uniformity in the scanned ion beam profile has been achieved.

According to embodiments of the present disclosure, before tuning a scan velocity profile for a uniform ion beam profile, it may be desirable to tune the ion source and/or the beam-line elements to minimize changes in the size or shape of the ion spot beam during scanning. First, an acceptable range of ion beam current may be identified and established. For example, a user may choose a target ion beam current and designate a ±5% range as an acceptable range. Second, the ion source and one or more other beam-line elements may be tuned to minimize changes in the shape or size of the ion spot beam while maintaining the ion beam current within the acceptable range. That is, instead tuning the ion source and the beam-line elements for a maximum ion beam current, it may only be necessary to keep the ion beam current within the acceptable range. Changes in the ion spot beam may be minimized by improving focus of the ion beam and/or centering the beam-line in every aperture or component. The cross-section of the ion beam may be changed so that it is less likely to be clipped by the various beam-line elements.

At this point it should be noted that the technique for uniformity tuning in an ion implanter system in accordance with the present disclosure as described above typically involves the processing of input data and the generation of output data to some extent. This input data processing and output data generation may be implemented in hardware or software. For example, specific electronic components may be employed in an ion implanter system or similar or related circuitry for implementing the functions associated with ion beam uniformity tuning in accordance with the present disclosure as described above. Alternatively, one or more processors operating in accordance with stored instructions may implement the functions associated with ion beam uniformity tuning in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A method for ion beam uniformity tuning, the method comprising:
    generating an ion beam in an ion implanter system;
    measuring a first ion beam current density profile along an ion beam path;
    measuring a second ion beam current density profile along the ion beam path; and
    determining a third ion beam current density profile along the ion beam path based at least in part on the first ion beam current density profile and the second ion beam current density profile.

2. The method according to claim 1, wherein the step of measuring the first ion beam current density profile further comprises measuring the first ion beam current density profile at one or more predetermined locations with one or more stationary measurement devices.

3. The method according to claim 2, wherein the one or more predetermined locations of the one or more stationary measurement devices are located along one or more sides of the ion beam path.

4. The method according to claim 2, wherein the one or more stationary measurement devices comprises at least one closed loop Faraday cup.

5. The method according to claim 1, wherein measuring the first ion beam current density profile measures the first ion beam current density profile as a function of time.

6. The method according to claim 1, wherein the step of measuring the second ion beam current density profile along the ion beam path further comprises scanning a cross-section of the ion beam via a mobile measurement device.

7. The method according to claim 6, wherein the mobile measurement device is positioned substantially in parallel with a wafer plane.

8. The method according to claim 6, wherein the mobile measurement device is a profiling Faraday cup.

9. The method according to claim 6, wherein measuring the second ion beam current density profile measures the second ion beam current density profile as a function of time and spatial position.

10. The method according to claim 1, wherein the third ion beam current density profile is a function of spatial position.

11. The method according to claim 1, further comprising:
determining a confidence level associated with a uniformity of the third ion beam current density profile.

12. The method according to claim 11, further comprising:
calculating a confidence interval based at least in part on the first ion beam current density profile, the second ion beam current density profile and the confidence level.

13. The method according to claim 12, further comprising:
determining whether the uniformity of the third ion beam current density profile is included within the confidence interval.

14. The method according to claim 13, wherein in the event that the uniformity of the third ion beam current density profile is included within the confidence interval, stopping the ion beam uniformity tuning.

15. The method according to claim 13, wherein in the event that the uniformity of the third ion beam current density profile is not included within the confidence interval, tuning one or more beam-line elements to adjust the uniformity of the third ion beam current density profile.

16. At least one processor readable medium for storing a computer program of instructions configured to be readable by at least one processor for instructing the at least one processor to execute a computer process for performing the method as recited in claim 1.

17. A system for uniformity tuning in an ion implanter system, the system comprising:
an ion source for generating an ion beam in an ion implanter system;
one or more first devices for measuring a first ion beam current density profile along an ion beam path;
a second device measuring a second ion beam current density profile along the ion beam path; and
a processor for determining a third ion beam current density profile along the ion beam path based at least in part on the first ion beam current density profile and the second ion beam current density profile.

18. The system of claim 17, wherein the one or more first devices comprises at least one closed loop Faraday cup located along one or more sides of the ion beam path.

19. The system according to claim 17, wherein the one or more first devices measures the first ion beam current density profile as a function of time.

20. The system according to claim 17, wherein the second device comprises a profiling Faraday cup for scanning a cross-section of the ion beam via a mobile measurement device.

21. The system according to claim 20, wherein the second device measures the second ion beam current density profile as a function of time and spatial position.

* * * * *